(12) United States Patent
Dupont (10) Patent No.: US 11,997,832 B2
(45) Date of Patent: May 28, 2024

(54) SYSTEM FOR COOLING SERVER BOARDS IN A DATA CENTER

(71) Applicant: CALYOS SA, Jumet (BE)

(72) Inventor: Vincent Dupont, Auderghem (BE)

(73) Assignee: CALYOS SA, Jumet (BE)

(*) Notice: Subject to any disclaimer, the term of this patent is extended or adjusted under 35 U.S.C. 154(b) by 206 days.

(21) Appl. No.: 17/388,495

(22) Filed: Jul. 29, 2021

(65) Prior Publication Data
US 2022/0039296 A1 Feb. 3, 2022

(30) Foreign Application Priority Data
Jul. 30, 2020 (FR) ........................... 2008131

(51) Int. Cl.
*H05K 7/20* (2006.01)

(52) U.S. Cl.
CPC ..... *H05K 7/20809* (2013.01); *H05K 7/20309* (2013.01); *H05K 7/20327* (2013.01); *H05K 7/20336* (2013.01)

(58) Field of Classification Search
CPC ........... H05K 7/20309; H05K 7/20327; H05K 7/20336; H05K 7/208–20827
See application file for complete search history.

(56) References Cited

U.S. PATENT DOCUMENTS

| | | | | |
|---|---|---|---|---|
| 7,318,322 B2* | 1/2008 | Ota | ..................... | H05K 7/20781 62/305 |
| 8,164,901 B2* | 4/2012 | Neudorfer | ................. | G06F 1/20 361/689 |
| 9,179,574 B2* | 11/2015 | Canney | ................. | F25B 25/005 |
| 10,448,543 B2* | 10/2019 | Farshchian | ............... | G06F 1/20 |
| 10,912,229 B1* | 2/2021 | Gao | .................... | H05K 7/20827 |

(Continued)

FOREIGN PATENT DOCUMENTS

| | | | |
|---|---|---|---|
| EP | 3324716 | 5/2018 | |
| EP | 3958659 A1 * | 2/2022 | ......... H05K 7/20836 |

(Continued)

OTHER PUBLICATIONS

Ramaswamy, "Combined effects of sub-cooling and operating pressure on the performance of a two-chamber thermosyphon," ITherm'98. 6th Intersociety Conference on Thermal and Thermomechanical Phenomena in Electronic Systems (Cat. No .98CH36208), 1998, pp. 349-355, , doi: 10.1109/ITHERM.1998.689586 (Year: 1998).*

*Primary Examiner* — Robert J Hoffberg
(74) *Attorney, Agent, or Firm* — Perman & Green, LLP (57) ABSTRACT

A cooling system, for cooling a plurality of server boards, includes at least one main two-phase fluid circuit, with a descending pipe, an ascending pipe, a loop bottom connector and an upper portion thermally coupled with at least one heat rendering exchanger. The cooling system also includes at least one evaporator coupled to a hot source to be cooled down in the server boards, a plurality of local circuits respectively serving one of the server boards and operating in bypass with respect to the main circuit. Each local circuit includes, on the one hand, a first branch, forming a feed-in on the descending pipe and, on the other hand, a second branch forming a fluid return in the ascending pipe of the main circuit, as well as an auxiliary circuit internal to the server board connected to one or several evaporator(s).

11 Claims, 7 Drawing Sheets

(56) References Cited

U.S. PATENT DOCUMENTS

| | | | |
|---|---|---|---|
| 11,109,517 B2* | 8/2021 | Farshchian | H05K 7/20672 |
| 11,406,041 B1* | 8/2022 | Cai | H05K 7/20272 |
| 2012/0297807 A1 | 11/2012 | Canney et al. | |
| 2013/0032310 A1* | 2/2013 | Jaena | H05K 7/1497 |
| | | | 165/138 |
| 2016/0014933 A1* | 1/2016 | Matsunaga | H05K 7/20827 |
| | | | 361/679.53 |
| 2016/0330873 A1* | 11/2016 | Farshchian | H05K 7/20672 |
| 2017/0196124 A1 | 7/2017 | Peng et al. | |
| 2020/0015387 A1 | 1/2020 | Farshchian et al. | |
| 2022/0287207 A1* | 9/2022 | Gao | H05K 7/20736 |
| 2023/0041910 A1* | 2/2023 | Provenziani | H05K 7/20781 |

FOREIGN PATENT DOCUMENTS

| | | | | |
|---|---|---|---|---|
| JP | 2013065227 A | * | 4/2013 | H05K 7/20818 |
| WO | WO-2021111387 A1 | * | 6/2021 | H05K 7/20254 |

* cited by examiner

SYSTEM FOR COOLING SERVER BOARDS IN A DATA CENTER

CROSS-REFERENCE TO RELATED APPLICATIONS

This application claims priority to and the benefit of French patent application number FR 2008131 filed on Jul. 30, 2020, the disclosure of which is incorporated herein by reference in its entirety.

BACKGROUND

1. Field

The present disclosure relates to cooling of electronic equipment in a data processing center. Nevertheless, the present disclosure may be applied to cool down various energy-intensive equipment, such as electronic, computer or telecommunication equipment.

2. Brief Description of Related Developments

A data processing center, targeted by the present disclosure, is commonly known under the name "data center".

A data processing center may be in the form of a computer room in a building; in this computer room, there is a plurality of rows of racks on which a plurality of energy-intensive functional equipment, for example server boards, is installed.

A data processing center may also be arranged in a so-called transport container, for example a standard 20-feet container or a standard 40-feet container.

In general, it is observed that computer equipment is housed inside an enclosure which protects them from the external environment. Nonetheless, it is necessary to discharge the calories produced by the computer equipment into the external environment.

For each computer rack, there is a front face enabling access of the staff for verification and maintenance operations and a rear face at the location where each of the server boards is connected, the connections being, on the one hand, electrical and, on the other hand, intended for cooling (fluidic).

Cooling systems by air ventilation have demonstrated their limitations. They are noisy and get fouled and above all they are extremely energy-intensive. Cooling systems by liquid flow, for example water, are subject to leakages and require the intervention of pump(s). Moreover, such cooling systems require the use of anticorrosion and antibacterial substances which might have detrimental effects on both the environment, the hardware and the staff in the event of a leakage.

More recently, engineers have turned to systems with a two-phase working fluid which have higher calorie-transfer efficiency, and what is mode, under a low temperature gradient. One or several evaporator(s) is/are placed on the heating elements of the server boards, a condenser is placed at the rear of the server board, and the two-phase working fluid is circulated between the evaporator and the condenser. Moreover, ice-cold water is circulated in a general circuit which extracts calories in contact with said condensers.

It is in this context that the inventors have looked to propose a solution that is functionally simpler with a "hotter" (hot coolant) cooling system but at the same time more robust with regards to possible malicious attacks in the form of an electric shutdown or a serious disturbance of the power supplies.

SUMMARY

To this end, is herein provided a cooling system for cooling a plurality of server boards located inside an enclosure (in one or several rack(s)), the system comprising:
at least one main two-phase fluid circuit serving the plurality of server boards, with a descending pipe, an ascending pipe, a loop bottom connector and an upper portion, said upper portion being thermally coupled with at least one heat rendering exchanger located outside the enclosure, said main two-phase fluid circuit generally operating according to the thermosiphon principle,
at least one evaporator in each of the served server boards, said evaporator being coupled to a hot source to be cooled down in the server boards (CPU, etc.),
a plurality of local circuits, each local circuit respectively serving one of the server boards and operating in bypass with respect to the main circuit, each local circuit comprising on the one hand a first branch, forming a feed-in from a tapping in the descending pipe and, on the other hand, a second branch forming a fluid return in the ascending pipe of the main circuit, as well as an auxiliary circuit internal to the server board connected to one or several evaporator(s), and wherein first sand second fluid-tight quick-disconnect fluid connectors are further provided, arranged respectively on each of the first and second branches,
the system containing no active pumping member, neither in the main circuit nor in the local circuits.

Thereby, the system operates in a completely passive mode, it has a very good immunity in the event of an electric power failure or more generally, in the event of a malicious attack of the data center.

In contrast with active pumping systems, for which an interruption of the electric power supply results in a temporary increase in the temperature just after the shutdown, thanks to the arrangement of the present disclosure hereinabove, even in the event of an electric power failure, cooling continues to be ensured constantly and smoothly which guarantees the absence of a thermal overload at the time of shutdown. Consequently, advantageously thanks to the disclosure, any temperature overshoot due to a lack of electric power supply is avoided.

Also notice that there is only one single working fluid that will closely extract calories from the members to be cooled down and which circulates up to the heat rendering exchanger which is located outside the enclosure. The number of thermal resistances placed in series is therefore considerably reduced in comparison with the existing thermal architectures consisting of several independent systems placed in cascades. Thus, the system is particularly simple, energy-efficient and economically relevant. It is also easy to maintain as it contains no active member that could break down.

Notice that each local circuit is composed by a first branch, the auxiliary circuit internal to the served server board, and the second branch.

As regards the terminology, by "descending pipe", it should be understood a pipe generally conveying the fluid from the top to the bottom, in particular between the heat rendering exchanger and the rack, but this does not exclude the possibility of having locally a horizontal portion and possibly an ascending portion. Similarly, by "ascending pipe", it should be understood a pipe generally conveying the fluid from the bottom to the top, but this does not exclude the possibility of having locally a horizontal portion and possibly a descending portion.

The system could operate with all or part of the hot sources being active, i.e. with all or part of the server boards operating. The system could also operate with all server boards operating at the maximum design thermal power. The loop bottom connector enables the flow rate of the fluid circulating in each local circuit to be independent of the flow rate of the fluid circulating in the main circuit. The flow rate of the fluid circulating through each evaporator is then set by the power of the associated hot source. The flow rate of the fluid circulating through each evaporator is not affected by the total power in the system. Also, in particular, the flow rate of the fluid circulating through each evaporator is not affected by the pressure difference between the tappings. In contrast with a standard thermosiphon, such an arrangement contributes to an important uncoupling between the "transport function" and the "heat exchange function". Drawing the liquid on the descending pipe further allows guaranteeing a liquid supply without any additional element (such as a phase separator) and with a subcooling level that is identical for all evaporators. Thus, for a given computing power, the operating temperature of the processor is the same regardless of the location of the circuit. Thus, although the liquid intakes are disposed in series from a fluidic perspective, the server boards could be considered to be in parallel from a thermal perspective.

In particular, the system is very stable and the start-up of the server boards just shifts the saturation temperature of the two-phase architecture.

Also notice that the suggested solution does not require any set-up in a false floor, unlike a number of known cases.

In various aspects of the present disclosure, it is also possible to further resort to either one of the following arrangements:

According to one option, it is possible to provide for each evaporator comprising a porous member which ensures a capillary pumping, so as to suck in the liquid from the first branch. Hence, there is no mechanical pump in the local circuit, the progress of the working fluid is caused by the evaporation in contact with the porous member and the re-supply of the porous member with the liquid that arrives from the first branch. Hence, the entire system is a combination of a thermosiphon-type general loop with a plurality of capillary-pumping local loops. There is no need for any ad hoc mechanical pump to cause a circulation of the working fluid in the main circuit and the local circuits.

According to one option, an injection nozzle forming the outlet of the second branch may be provided for rendering the fluid into the ascending pipe, said injection nozzle delivering the fluid into the ascending pipe. Advantageously, the injection nozzle delivers a fluid including at least one vapor phase proportion in the ascending pipe of the main circuit which causes, on the one hand, a movement of the fluid at this location by the exchange of the momentum related to the ejection speed and, on the other hand, the supply of gas bubbles which contribute in reducing the density of the fluid in the ascending pipe towards the heat rendering exchanger in comparison with the descending pipe, in other words to activate the thermosiphon effect on the loop.

According to one option, the server boards may be disposed horizontally and are spaced apart on top of one another in the vertical direction in a computer rack, said computer rack having a front face and a rear face, the descending and ascending pipes covering the rear face of the computer rack, the first and second quick-disconnect fluid connectors being arranged on the rear face side. Thereby, it is possible to access the server boards from the front face, and the electrical connections as well as the fluidic connections are arranged on the rear face of the server boards. Proper operation indicators or warning indicators, visible at a good distance, as well as handles for removing the server board where appropriate, may be provided on the front face.

According to one option, the auxiliary circuit of each local circuit featured some flexibility adapted for displacing one of the evaporators connected to the auxiliary circuit. Thus, the displacement of one of the evaporators enables access to the component thermally-coupled to the evaporator without the need for uncoupling other elements off the auxiliary circuit. This flexibility also allows absorbing the variations of the volume of the liquid introduced into the auxiliary circuit before connecting the server.

According to one option, the server boards may be arranged on slides, each server board could then be selectively disconnected by forward translation along the slide. This manoeuvre allows disconnecting electrical connectors through the same translation/pull movement, after uncoupling of the fluid-tight quick-disconnect fluid connectors.

According to one option, the first and second branches feature some flexibility adapted for uncoupling of the fluid-tight quick-disconnect fluid connectors independently of a forward translation of the associated server board. Thus, it is possible to disconnect the local circuit of one of the server boards before actual removal of the server board.

According to one option, the descending and ascending pipes of the main two-phase fluid circuit may have a first cross-section and the first and second branches of the local circuits have a second cross-section, the first cross-section being at least twice as large as the second section in surface and/or in diameter. Thereby, if all server boards operate simultaneously and deliver calories in their respective local circuit, the passage section of the descending and ascending pipes are sufficient to withstand the addition of the circulations caused by the cumulated circulation induced by all of the server boards.

According to one option, The D1/D3 ratio may be greater than 3. Thus, one single main circuit could serve more than 20 server boards for example 24 server boards or 32 server boards.

According to one option, the two-phase working fluid may be in a subcooled state in the descending pipe. Thus, in the main circuit, in particular in the ascending pipe, there is a working fluid mixture in the vapor and liquid form. Subcooling provides a cold reserve which allows condensing on the spot ("direct contact condensation") part of the vapor bubbles that arrive in the ascending pipe. In the case where this direct condensation is total, the heat rendering exchanger actually consist of a subcooler, that is to say a liquid phase exchanger.

According to one option, an optional forced air convection may be provided to improve the performances of the heat rendering exchanger. This device may be activated if the external temperature is very high. For example, a fan that blows over the heat rendering exchanger is used.

The present disclosure also relates to a parallelepiped-shaped metallic container, with standard dimensions of the transport container type, namely 20 feet or 40 feet long, comprising a cooling system as described before. Thus, it is possible to build a movable and low-cost data center.

According to one option, the heat rendering exchanger may be arranged above the roof of the container. Hence, the footprint is not enlarged by the presence of the suggested cooling system, several containers may be arranged next to one another either along the long side or along the short side and even along both of them at the same time.

According to one option, the heat rendering exchanger may be arranged adjacent to one side of the container, outside the container. Then, it is possible to stack such containers on top of one another.

According to one option, the heat rendering exchanger may consist of a condenser and/or a member adapted to subcool a working fluid. Thus, a transfer of calories could be performed between a working fluid and the heat rendering exchanger through condensation of a vapor phase of the working fluid and/or subcooling of a liquid phase of the working fluid.

According to one option, solar panels may be arranged on top of the heat rendering exchanger which, in turn, is arranged above the roof of the container. This solution allows for a more efficient cooling when the external temperature is hot and in combination with a battery system, a full autonomy of the cooling system which prevents any malicious attack from outside ("thermal attack on data centers").

According to one option, a heat rendering exchanger that is common to a plurality of main fluid circuits may be arranged. The advantage consists in reducing the temperature of the working fluid in case of partial use of part of the servers.

According to one option, the heat rendering exchanger may comprise a cold source, in particular in the form of a liquid, for example water, exchanger. This allows reducing the size of the heat rendering exchanger and also recovering the energy (for example of the hot water) for a secondary use (for example for heating a building in winter or a swimming pool). The thermal performances of the system also allow using relatively hot cold sources ("hot cooling") more easily.

According to one option, as a working fluid, it is possible to use R1233zd(E). The working fluid R1233zd(E) is dielectric and non-flammable.

According to one option, as a working fluid, it is possible to use R1336mzz(Z). The working fluid R1336mzz(Z) is non-flammable and has a lower operating pressure than the working fluid R1233zd(E). The working fluids R1233zd(E) and R1336mzz(Z) have also recently been developed to limit the environmental impact.

According to one option, the pressure prevailing in the working fluid could be higher than or equal to 2 bars, preferably higher than or equal to 3 bars and/or lower than or equal to 8 bars, preferably lower than or equal to 6 bars.

BRIEF DESCRIPTION OF DRAWINGS

Other features and advantages of the present disclosure will appear throughout the following description of one of the aspects thereof, provided as a non-limiting example, with reference to the appended drawings, wherein:

FIG. 1 schematically represents a side view of a data center type equipment arranged in an enclosure, with a cooling system according to the present disclosure, FIG. 2 illustrates a perspective view of a local circuit serving a server board, FIG. 3 illustrates a perspective rear view of twenty server boards arranged on top of one another in a computer rack, FIG. 4 schematically represents a top view of data center equipment of FIG. 1, FIG. 5 schematically represents a front view of a data center equipment of FIG. 1, FIG. 6 schematically represents the arrangement of a server board, with a first configuration, FIG. 7 illustrates the connection area between the main circuit and a local circuit in the case of the first configuration of FIG. 6, FIG. 8 schematically represents the general arrangement of a server board according to one variant, with a second configuration, FIG. 9 illustrates the connection area between the main circuit and a local circuit in the case of the second configuration of FIG. 8, FIG. 10A and FIG. 10B represent two general arrangements of a data center contained in a transport container with the 20 or 40 feet standard dimension, in particular the position of the condenser(s), FIG. 11 illustrates some geometric features of the system, FIG. 12 illustrates some geometric features of the system in another configuration, FIG. 13 schematically represents a sectional view of an evaporator disposed in contact with a hot source of a server board, FIG. 14 schematically represents a top view of a data center type equipment arranged in an enclosure in a variant of arrangement, with a cooling system according to the present disclosure, FIG. 15 schematically represents a side view of the data center type equipment of FIG. 14.

DETAILED DESCRIPTION

In the different figures, the same reference numerals refer to identical or similar elements. For clarity of the disclosure, some elements are not necessarily represented to scale.

In the following description, when referring to absolute position qualifiers, such as the terms "front", "rear", "top", "bottom", "left", "right", etc., or relative qualifiers, such as the terms "above", "below", "upper", "lower", etc., or to orientation qualifiers, such as "horizontal", "vertical", etc., reference is made to the orientation of the figures, unless stated otherwise.

Next, the vertical direction Z should be understood as the direction aligned with the gravity acceleration vector. The longitudinal X and transverse Y directions correspond to directions that are perpendicular to the vertical direction Z. The longitudinal X and transverse Y directions are horizontal. The longitudinal X and transverse Y are perpendicular to one another.

Depending on its importance, a data center occupies one or several room(s) of a building. Herein, in this case, as illustrated in FIGS. 1, 4, 5, 10A and 10B, a transport container type metallic container is used. Such a metallic container is parallelepiped-shaped, having a standard dimension namely 20 feet or 40 feet long, measured in the longitudinal direction X. This container type is a widespread standard, its manufacturing cost for the data center cost turns out to be interesting. The metallic container forms an enclosure 9 in which computer equipment are disposed. The use of a container is optional, standard buildings may be equipped with the present disclosure.

The computer equipment may comprise server boards 3. The server boards may be in the 19-inch format (but they could be in another format). The server boards are disposed in computer racks 7. Each computer rack has a front face 71 and a rear face 72. Proper operation indicators or warning indicators, visible at a good distance, may be provided on the front face. A front aisle 91 and a rear aisle 92 in the enclosure 9 enable a user U to access the server boards respectively from the front face and the rear face of the racks. Thus, a good accessibility to the computer equipment is ensured.

Each rack 7 includes carrier structures, lateral panels, and arrangements such as sliders, slides, panels, grommets, front and/or rear doors . . . , adapted to enable the installation, lifting, fastening . . . , stacking, superimposition . . . —and the cables of the functional equipment. Nonetheless, these racks may also be dedicated to a system built by equipment manufacturers (large servers, calculators, data storage units . . . ) and although these are identified as "standalone"-type equipment, they nevertheless remain treated like the aforementioned racks in this considered application.

The server boards 3 may be arranged horizontally or vertically. A preferred configuration is illustrated where the server boards are arranged horizontally and disposed on top of one another in the computer racks 7.

The server boards 3 are herein arranged on slides. Each server board could then be selectively displaced out of the rack by forward translation along the slide. To this end, each server board may comprise a handle (or two handles preferably to allow for a better application of the mechanical force) at the front face of the rack. Moreover, electrical connections 31 of each server board are herein provided at the rear face 72 of the rack.

The considered computer equipment, in particular the server boards of the data center generate a huge amount of heat which must be evacuated for the operation of the functional equipment to remain unaffected. A cooling system is then provided to cool down the server boards 3 located inside the container. In particular, according to the illustrated example, one cooling system is provided for each rack. Next, a cooling system is described in more details.

Figure 1:
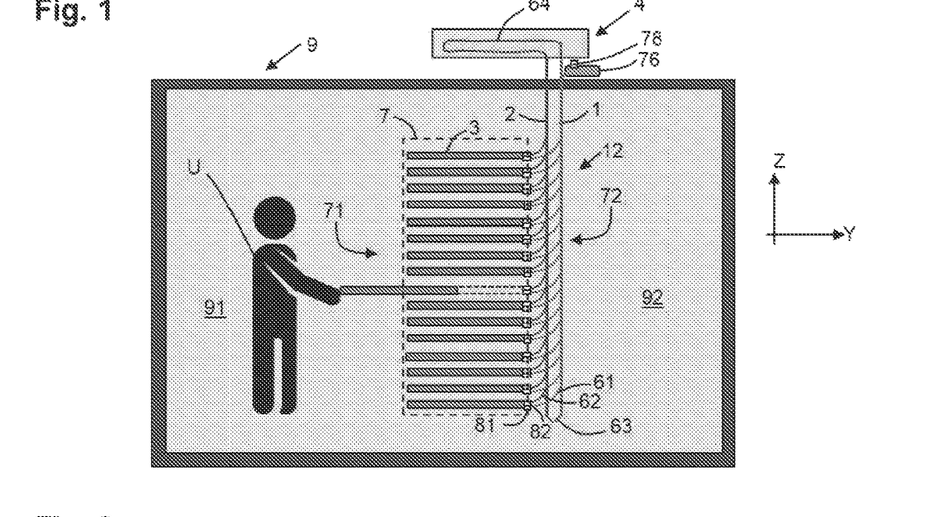
Figure 2:
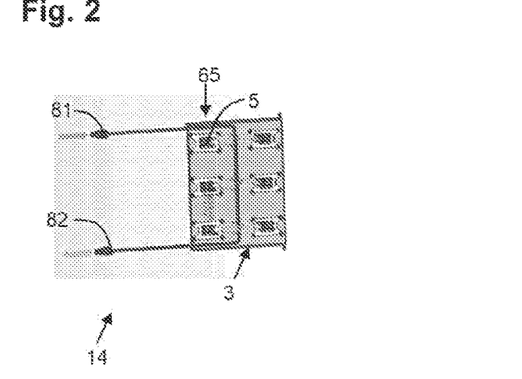

Referring to FIG. 1, the cooling system comprises a main two-phase fluid circuit 12 in which a working fluid circulates. The main circuit comprises a descending pipe 1, an ascending pipe 2, a loop bottom connector 63 and an upper portion 64. The descending and ascending pipes 1, 2 cover the rear face of the rack. The working fluid can circulate through the main circuit in a closed loop, without any interaction with the atmosphere. The working fluid circulates in the main circuit in the direction of the arrows represented in FIGS. 7, 9, 11 and 12.

The upper portion 64 is thermally coupled to a heat rendering exchanger 4 located outside the enclosure 9.

Figure 4:
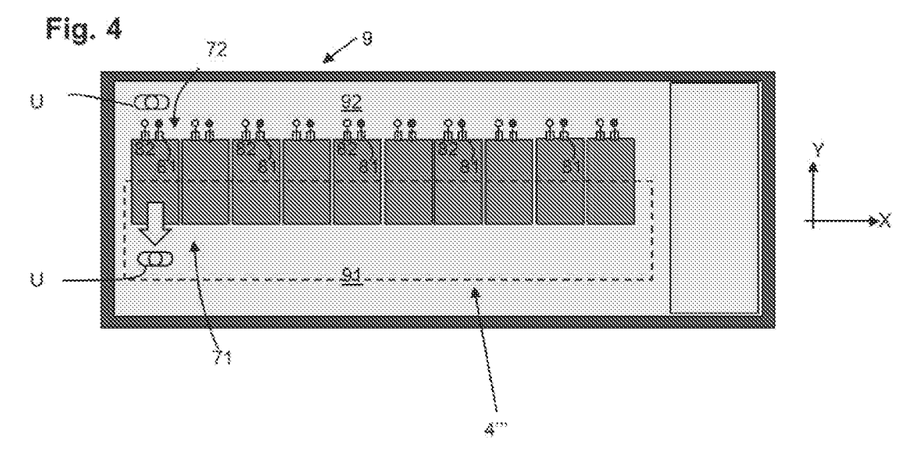
Figure 5:
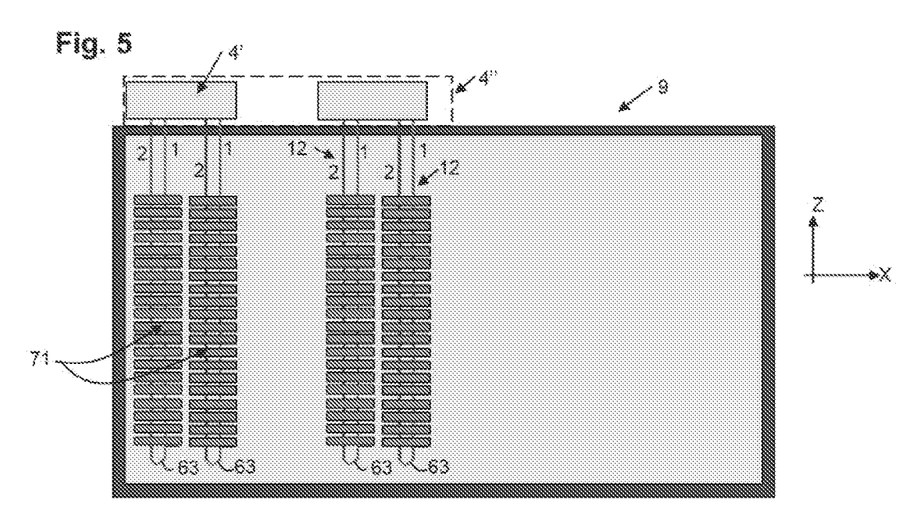

According to the example represented in FIG. 1, each main fluid circuit may be coupled to a heat rendering exchanger 4. Alternatively, it is possible to provide for arranging a heat rendering exchanger than is common to a plurality of main fluid circuits. FIG. 5 represents a first example where the main fluid circuits of 2 cooling systems are coupled to a common heat rendering exchanger 4' and a second example where the main fluid circuits of 4 cooling systems are coupled to a common heat rendering exchanger 4''. FIG. 4 represents an example where the main circuits of all cooling systems inside the container are coupled to a common heat rendering exchanger 4'''. The advantage of a common heat rendering exchanger consists in reducing even further the saturation temperature of the working fluid of the main fluid circuits associated to the active racks, in case of partial use of the racks.

Figure 10A:
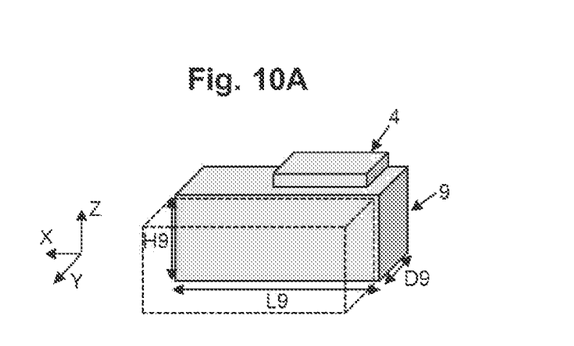

As represented in FIG. 10A, the heat rendering exchanger 4 may be arranged above the roof of the container. Hence, the footprint is not enlarged by the presence of the suggested cooling system, several containers may be arranged next to one another either in the longitudinal direction X or in the transverse direction Y and even on the longitudinal X and transverse Y directions at the same time. It is also possible to provide for arranging solar panels on top of the heat rendering exchanger which is itself arranged above the roof of the container or shifted proximate to the container. These panels may be folded down when transporting the container and deployed once the container is on site thanks to the use of large-section flexible pipes.

Figure 10B:
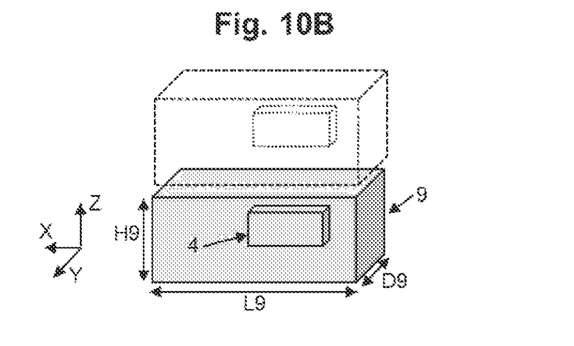

As represented in FIG. 10B, the heat rendering exchanger may be arranged adjacent to one side of the container, outside the container. Then, it is possible to stack such containers on top of one another in the vertical direction Z.

Moreover, it is further possible to provide for an optional forced air convection to improve the performances or to reduce the size and the cost of the heat rendering exchanger 4. This hybrid device could be activated in case of a very high external temperature. For example, a fan is used which blows over the heat rendering exchanger. Where appropriate, the fan may be powered by solar panels for a total autonomy of the data center. Alternatively, it is possible to provide for a forced liquid convection. For example, the data center enclosure could be disposed on a boat or a barge so that the heat rendering exchanger could consist of a forced pipe conveying water surrounding the water or the barge.

Moreover, the main two-phase fluid circuit 12 serves the plurality of server boards of the associated rack. To this end, the system comprises a plurality of local circuits 14. Each local circuit respectively serves one of the server boards 3 and operates in bypass with respect to the main circuit 12. In other words, each local circuit operates shunted with respect to the main circuit 12. More particularly, the different elements of one of the local circuits are shown in FIGS. 2, 6 to 9 and 13.

First of all, each local circuit 14 comprises a first branch 61, forming a feed-in from a tapping 16 in the descending pipe.

Afterwards, each local circuit comprises an auxiliary circuit 65 internal to the server board. The auxiliary board is connected to at least one evaporator 5 of the served server board. Each evaporator is coupled to a hot source 51-56 to be cooled down in the server board (CPU, GPU, . . . ). Cooling of the components of the server board that are not treated by the associated auxiliary circuit may be ensured by a simple constant and low-intensity air flow.

Figure 13:
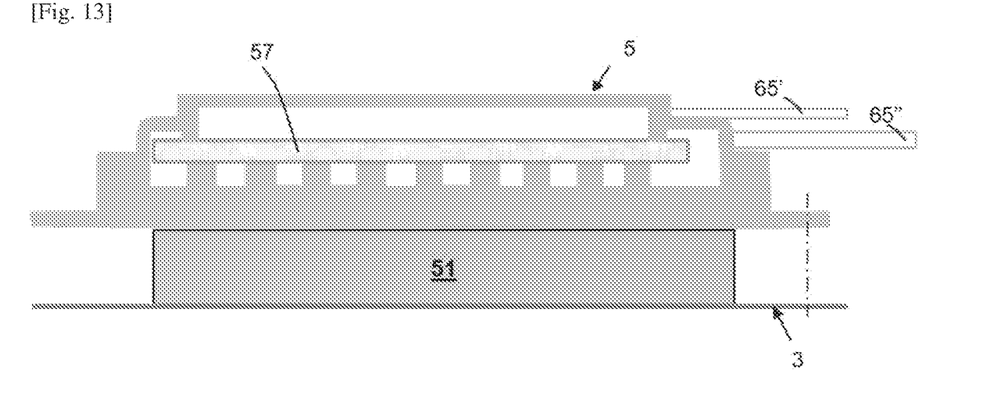

Referring to FIG. 13, each evaporator 5 comprises a porous member 57 which ensures a capillary pumping, so as to suck in the liquid from the first branch 61 via a liquid pipe 65' and release the vapor towards the second branch 62 via a vapor pipe 65". Hence, there is no mechanical pump in the local circuit, the progress of the working fluid is caused by the evaporation in contact with the porous member and the re-supply of the porous member with the liquid that arrives from the first branch.

The auxiliary circuit 65 may feature some flexibility adapted for moving one of the evaporators connected thereto. Thus, during the manufacture of the server or during maintenance, one of the evaporators could be displaced in order to access to a component of the server board thermally coupled thereto. For this purpose, the auxiliary circuit may be made of copper, stainless steel, aluminium, reinforced plastic or any other material that ensures a good barrier, on the one hand, to the working fluid so as not to waste it (except during the connection/disconnection phases described later on) and, on the other hand, to the molecules present in the ambient air so that these could not penetrated into the circuit.

Finally, each local circuit comprises a second branch 62 forming a fluid return in the ascending pipe 2 of the main circuit. For this purpose, an injection nozzle 17 forms the outlet of the second branch. The injection nozzle delivers fluid into the ascending pipe.

Figure 6:
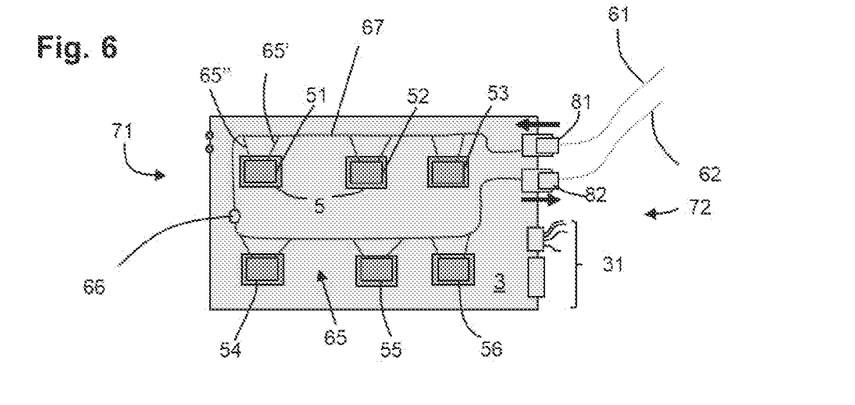
Figure 7:
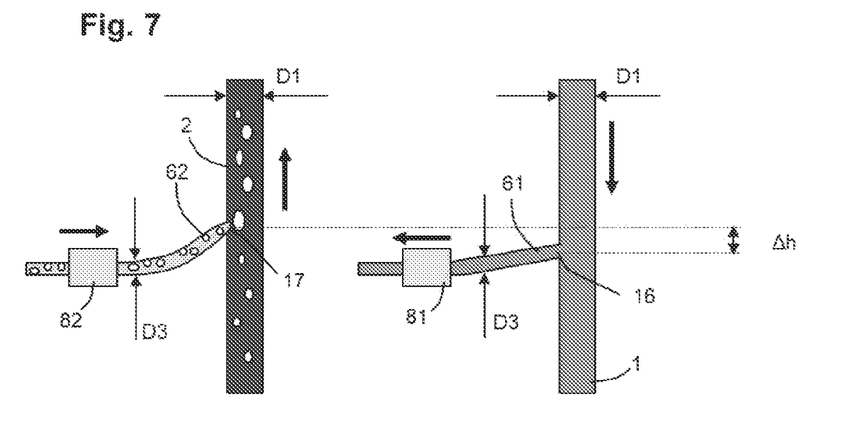

According to a first configuration illustrated in FIG. 6, the auxiliary circuit 65 may comprise a fluid line 67 to which each evaporator is mounted shunted. Each of the liquid and vapor pipes 65', 65" of each evaporator is connected to the fluid line 67. The fluid line communicates, on the one hand, with the first branch 61 and, on the other hand, with the second branch 62. The fluid line then comprises a working fluid in a two-phase form. As illustrated in FIG. 7, in the first configuration, the injection nozzle delivers the two-phase working fluid in the ascending pipe comprising a liquid phase and a vapor phase. This two-phase pipe is particularly interesting if less dissipative appended heat sources have to be cooled down in the vicinity of the evaporators (non-capillary evaporators).

Figure 8:
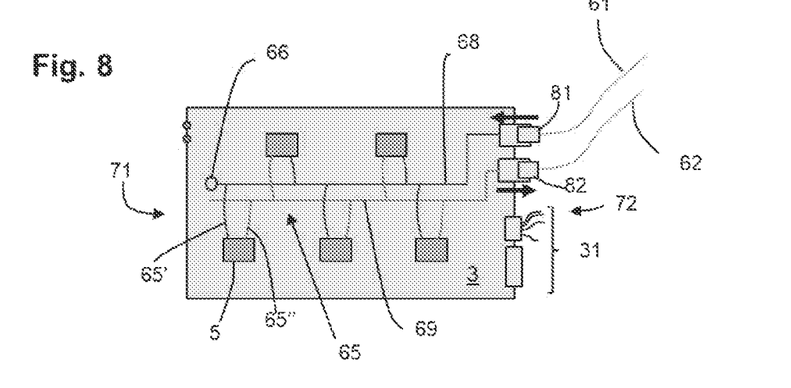
Figure 9:
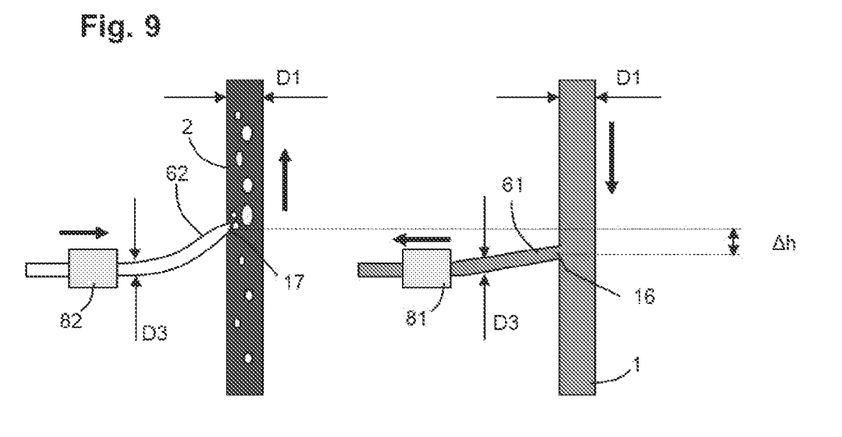

Alternatively, according to a second configuration illustrated in FIG. 8, the auxiliary circuit 65 may comprise a liquid line 68 comprising a fluid mainly in the liquid phase and a vapor line 69 comprising a fluid mainly in the vapor phase. The liquid line 68 communicates with the first branch 61 and feeds in each evaporator independently via their respective liquid pipe 65'. The vapor line 69 is fed independently by each evaporator via their respective vapor line 65" and communicates with the second branch 62. The second configuration has the advantage of reducing pressure drops through the auxiliary circuit 65. As illustrated in FIG. 9, in the second configuration, the injection nozzle delivers the working fluid in the ascending pipe only in the vapor form.

In each configuration, the injection nozzle 17 delivers a fluid including at least one vapor phase proportion in the ascending pipe 2 of the main circuit 12 which causes, on the one hand, a movement of the fluid at this location by the exchange of the momentum related to the ejection speed and, on the other hand, the supply of gas bubbles which contribute in reducing the density of the fluid in the ascending pipe towards the heat rendering exchanger in comparison with the density of the fluid present in the descending pipe.

The main two-phase fluid circuit then operates according to the thermosiphon principle. In other words, the working fluid circulates through the main fluid circuit because of a density difference of the working fluid. The density difference is herein produced by the effect of temperature (for example, the fluid in the descending pipe may be subcooled) and/or by the void fraction in the ascending pipe.

Figure 3:
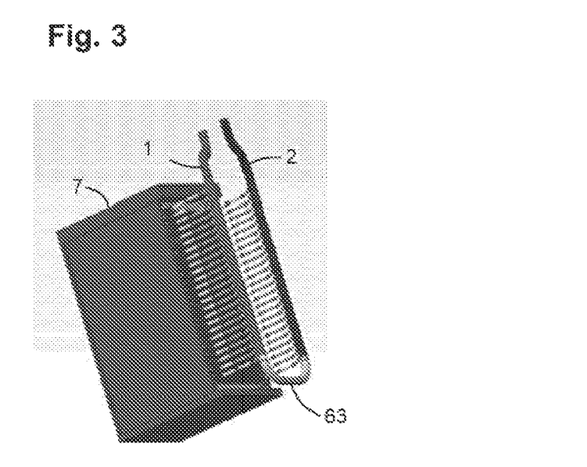

Thus, the movement of the fluid in the main fluid circuit is possible only when a sufficient portion of the pipe is disposed above the evaporator associated to the uppermost server in the rack. Henceforth, by "descending pipe", it should be understood a pipe generally conveying the fluid from the top to the bottom, from the heat rendering exchanger towards the rack, but this does not exclude the possibility of having locally a horizontal portion and possibly an ascending portion. Similarly, by "ascending pipe", it should be understood a pipe generally conveying the fluid from the bottom to the top, from the rack towards the heat rendering exchanger but this does not exclude the possibility of having locally a horizontal portion and possibly a descending portion. In the example of FIG. 3, each of the ascending and descending pipes comprises a planar portion.

Hence, the entire system is a combination of a thermosiphon-type loop with a plurality of capillary-pumping local loops. There is no need for any ad hoc mechanical pump to cause a circulation of the working fluid in the main circuit and the local circuits. Thereby, the system operates in a completely passive mode, it has a very good immunity in the event of an electric power failure or more generally, in the event of a malicious attack of the data center.

Figure 11:
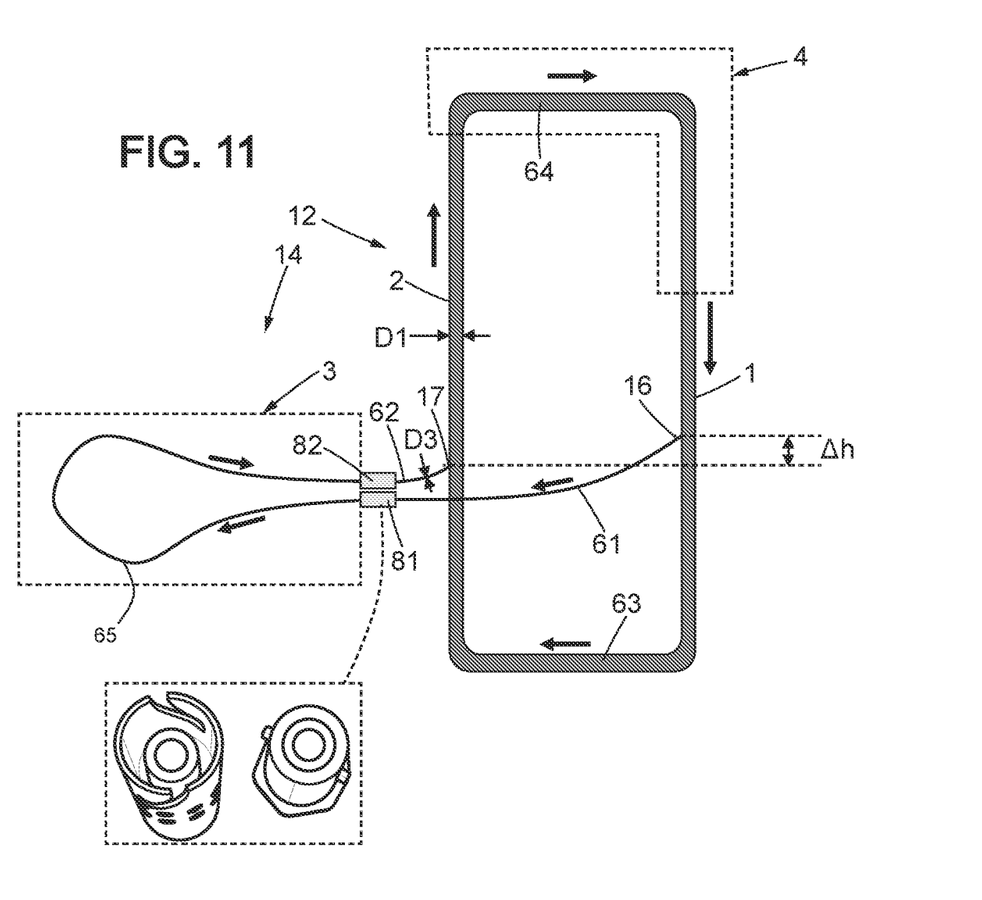
Figure 12:
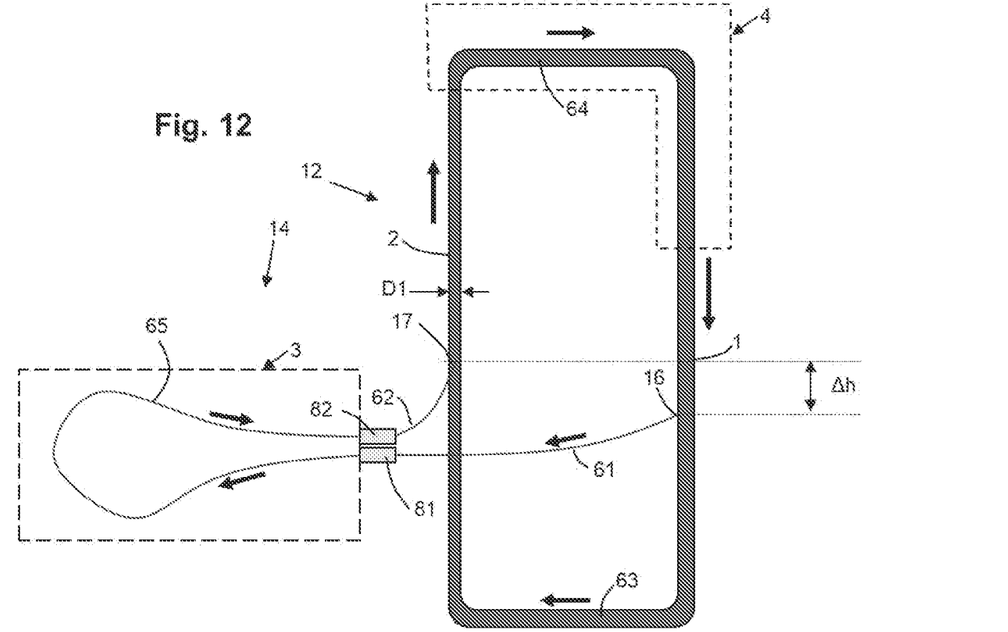

Moreover, a height difference $\Delta h$, in the vertical direction, between the tapping 16 and the injection nozzle 17 could be provided for all or part of the local circuits 14. Advantageously, the injection nozzle is disposed higher than the tapping as represented in FIGS. 7, 9 and 12. Such an arrangement produces a pressure difference in the associated local circuit between the injection nozzle and the tapping which then adds to the capillary pressure generated by the porous member 57 and which thereby promotes the movement of the two-phase working fluid in the local circuit from the tapping towards the injection nozzle. Nonetheless, it is not excluded to dispose the tapping higher than the injection nozzle as represented in FIG. 11. The height difference between the tapping and the injection nozzle of one of the local circuits could be smaller than or equal to 600 mm.

Specifically, all tappings 16 are disposed on the descending pipe of the main loop and all injection nozzles are disposed on the ascending pipe of the main loop. The tapping 16 of each auxiliary circuit 14 is disposed upstream of all fluid returns in the main loop from an auxiliary circuit. Thus, it is ensured that each auxiliary circuit is fed with the fluid at the same temperature.

The heat rendering exchanger 4 may consist of a condenser. Thus, the vapor phase of the fluid circulating in the ascending pipe 2 of the main circuit is condensed when the fluid circulates through the condenser. The heat rendering exchanger could further subcool the working fluid. The two-phase working fluid may then be in a subcooled state in the descending pipe. Thus, the flow rate of the subcooled fluid forms a cold source which allows condensing part of the vapor bubbles that arrive in the ascending pipe directly in contact with a liquid. Alternatively, the heat rendering exchanger 4 may produce just a subcooling of the working fluid, all of the vapor bubbles arriving in the ascending pipe then being condensed by the cold reserve of the working fluid. In the last case, where there is a complete condensation at the outlet of the ascending pipe, the heat rendering exchanger could then be disposed under the data center. Such an arrangement could be advantageous for a data center in a ship for example (data center in sea).

The cooling system could operate with all or part of the hot sources being active, i.e. with all or part of the server boards operating. The cooling system could also operate with all server boards operating at the maximum design thermal power. The loop bottom connector 63 enables the flow rate of the fluid circulating in each local circuit to be independent of the flow rate of the fluid circulating in the main circuit. The flow rate of the fluid circulating through each evaporator is then set by the power of the associated hot source. In contrast with a standard thermosiphon, such an arrangement of the cooling system contributes to an important uncoupling between the function of transporting the working fluid and the function of heat exchange between the working fluid and the hot sources. This uncoupling suppresses the thermal instabilities of conventional high-power thermosiphons.

As represented in FIGS. 7, 9, 10, 11, the descending and ascending pipes 1, 2 of the two-phase fluid main circuit may have a first cross-section D1 and the first and second branches 61, 62 of the local circuits have a second cross-section D3, the first section being at least twice as large as the second section in surface and/or in diameter. Thereby, if all server boards operate simultaneously and deliver calories in their respective local circuit; the passage section of the descending and ascending pipes are sufficient to withstand the addition of the flow rates caused by the cumulated circulation induced by all of the server boards. The D1/D3 ratio may be greater than 3. Thus, one single main circuit could serve more than 20 server boards for example 24 server boards or 32 server boards. The first cross-section may have a diameter that is larger than or equal to 20 mm and/or smaller than or equal to 50 mm. The second cross-section may have a diameter that is larger than or equal to 5 mm, preferably larger than or equal to 8 mm and/or smaller than or equal to 15 mm, preferably smaller than or equal to 14 mm. For example, such a cooling system may contain a working fluid volume equal to 10 litres.

Furthermore, as a working fluid, it is possible to use R1233zd(E). The working fluid R1233zd(E) is dielectric and non-flammable. Alternatively, as a working fluid, it is possible to use R1336mzz(Z). The working fluid R1336mzz(Z) is non-flammable and has a lower operating pressure than the working fluid R1233zd(E). The working fluids R1233zd(E) and R1336mzz(Z) have recently been developed to limit the environmental impact.

To enable an easy and quick removal of the server boards, there are also provided first and second fluid-tight quick-disconnect fluid connectors 81, 82, visible in FIG. 11, arranged respectively on each of the first and second branches 61, 62. Moreover, the first and second fluid-tight quick-disconnect fluid connectors 81, 82 may be connected to the auxiliary circuit 65 at one side of the rear face of the rack. The first and second fluid connectors 81, 82 enable uncoupling between the auxiliary circuit 65 associated to one of the server boards and the main circuit 12 while the other server boards of the rack are operating. Hence, in case of replacement of one of the server boards, there is no interruption of the flow rate in the main circuit and in the local circuits of the other server boards. For example, the first and second fluid connectors may consist of CEJN 487 quick connectors.

The pressure prevailing in the working fluid could be higher than or equal to 2 bars, preferably higher than or equal to 3 bars. Also, the pressure of the working fluid could be lower than or equal to 8 bars, preferably lower than or equal to 6 bars. Thus overpressure is advantageous to limit the air intake during connections/disconnections of the server.

Moreover, the first and second branches 61, 62 feature some flexibility adapted for uncoupling of the fluid-tight quick-disconnect fluid connectors independently of a forward translation of the associated server board. For this purpose, the first and second branches may be made of copper, stainless steel, aluminium, reinforced plastic or any other material that ensures a good barrier, on the one hand, to the working fluid so as not to waste it (except during the connection/disconnection phases described later on) and, on the other hand, to the molecules of ambient air so that these could not penetrated into the circuit. Thus, after a determined waiting time after shutdown of the server, guaranteeing a reasonable temperature of the latter and of its connectors, a user U can uncouple the auxiliary circuit associated to one of the server boards of the main circuit, before actually removing the server board from the rack through a forward translational movement. The electrical connectors could be disconnected by the translational movement for removing the server board.

Each auxiliary circuit associated to a server board may also comprise an opening 66. Thus, it is possible to load an auxiliary circuit with working fluid before coupling it to the main fluid circuit during the insertion of a new server board in the rack. Thus, we avoid an air intake into the main circuit and/or a pressure drop in the cooling system during coupling of an auxiliary circuit with the main circuit. It is also possible to provide for loading or emptying an auxiliary circuit via the fluid-tight quick-disconnect fluid connectors 81, 82.

The cooling system may also comprise a tank 76 as represented in FIG. 1. The tank may be connected to the descending pipe 1. This tank serves as an expansion vessel for the working fluid, and contains the working fluid in both the liquid phase and the vapor phase. The tank also allows managing the slight variations of the liquid amount due to the successive connections/disconnections. The tank may also be provided with a heating element for controlling the operating temperature of the cooling system. The tank herein comprises a maintenance valve 78 for venting/feeding the cooling system with the working liquid or still to remove air that would have possibly penetrated into the cooling system.

The present cooling system could be pressurised using a non-condensable gas at the tank to passively prevent any vaporisation below a minimum temperature. For example, under extremely cold conditions and in the event of an electric power failure, we avoid having the interior of the data center falling down to temperatures that could damage the equipment.

The disclosure is not limited only to the previously-described examples and numerous variants could be considered.

According to a non-represented variant, 2 racks could be disposed vertically on top of one another, each local circuit associated to a server board of one of the racks being served by a main circuit that is common to the 2 racks.

According to a non-represented variant, 2 racks could be disposed "back-to-back" so that the rear face of one of the racks is opposite the rear face of the other rack, each local circuit associated to a server board of one of the racks being served by a main circuit that is common to the 2 racks. The main circuit may be disposed between the rear faces of the 2 racks.

Figure 14:
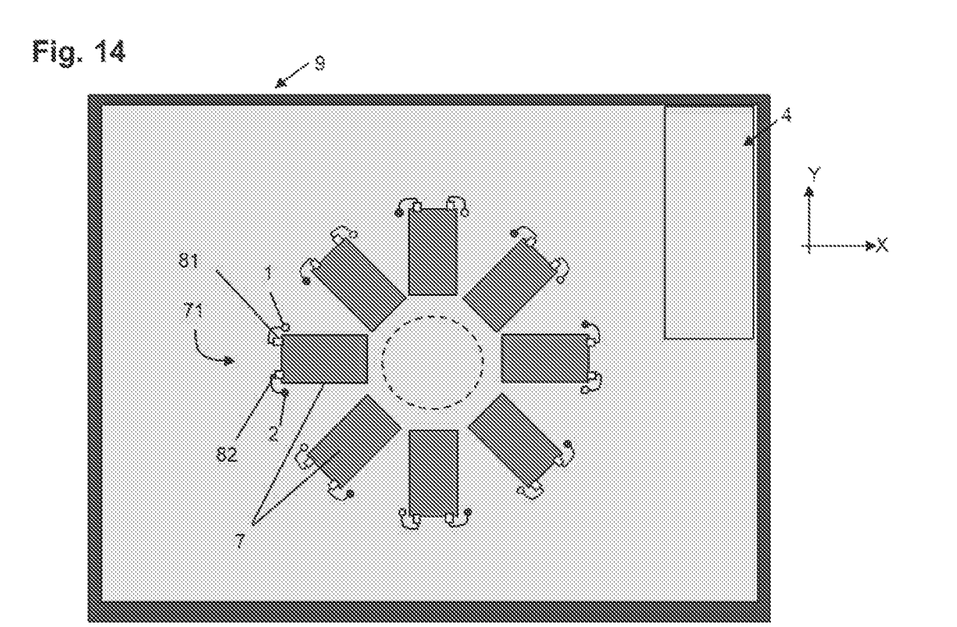
Figure 15:
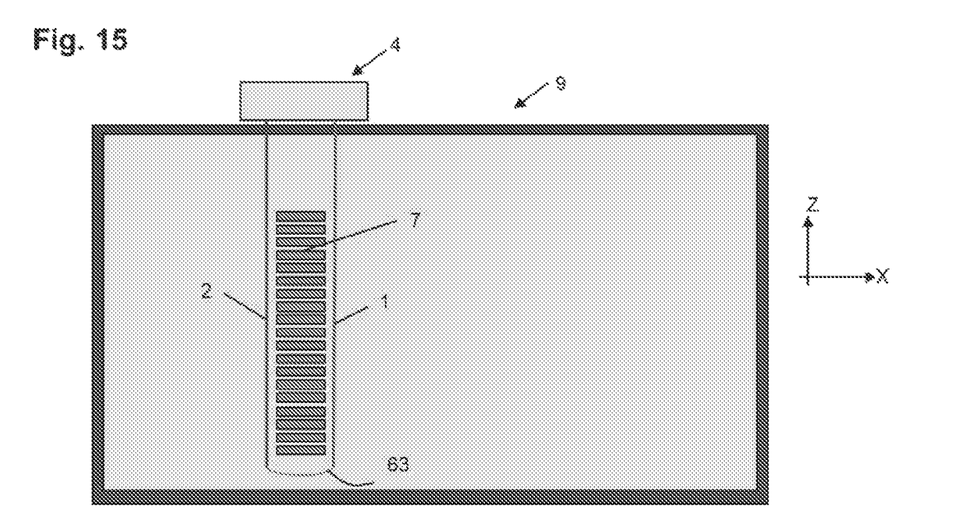

According to a variant represented in FIGS. 14 and 15, an arrangement of the racks 7 in circle could also be considered. Such an arrangement optimises the distance separating each rack from the other racks. Thus, the lag of the communication between the racks is reduced. In this arrangement, the fluid connectors 81, 82 may be provided on the front face 71. The ascending and descending pipes 1, 2 are disposed in a space formed between two adjacent racks. The bottom connector of the loop 63 could extend in a free space located beneath the rack. Thus, the operator can intervene without having to access a central area of the racks that is difficult to access

What is claimed is:
1. A cooling system for cooling a plurality of server boards located inside an enclosure, the cooling system comprising:
 at least one main two-phase fluid circuit serving the plurality of server boards and in which a working fluid circulates, with a descending pipe in which the working fluid circulates in a liquid phase of the working fluid, an ascending pipe in which the working fluid circulates in a mixture of the liquid phase and a vapor phase of the working fluid, a loop bottom connector and an upper portion, said upper portion being thermally coupled with at least one heat rendering exchanger located outside the enclosure, said at least one main two-phase fluid circuit operating according to the thermosiphon principle, at least one evaporator in each of the plurality of server boards served by the at least one main two-phase fluid circuit, said at least one evaporator being coupled to a hot source to be cooled down in the plurality of server boards, and a plurality of local circuits, each of the local circuits respectively serving one of the plurality of server boards and operating in bypass with respect to the loop bottom connector of the at least one main two-phase fluid circuit, each of the local circuits comprising on the one hand a first branch, forming a feed-in from a tapping in the descending pipe and, on the other hand, a second branch forming a fluid return in the ascending pipe of the at least one main two-phase fluid circuit, as well as an auxiliary circuit internal to a respective one of the server boards connected to one or several of the at least one evaporator, wherein first and second fluid-tight quick-disconnect fluid connectors are further provided, arranged respectively on each of the first and second branches, wherein the cooling system operates with passive fluid flow throughout in the at least one main two-phase fluid circuit and in the local circuits, wherein the loop bottom connector is independent of flow rate from each of the plurality of local circuits, the loop bottom connector being disposed at a lower location than each of the plurality of server boards and thermally decoupled from each of the plurality of server boards, and wherein the working fluid circulates throughout the loop bottom connector from the descending pipe to the ascending pipe by being entirely in the liquid phase of the working fluid.

2. The cooling system according to claim 1, wherein each of the at least one evaporator comprises a porous member which ensures a capillary pumping, so as to suck in a liquid from the first branch.

3. The cooling system according to claim 1, wherein an injection nozzle, forming an outlet of the second branch, is provided for rendering the working fluid into the ascending pipe, said injection nozzle delivering the working fluid into the ascending pipe.

4. The cooling system according to claim 1, wherein the plurality of server boards are disposed horizontally and are spaced apart on top of one another in a vertical direction in a computer rack, said computer rack having a front face and a rear face, the descending and ascending pipes covering the rear face of the computer rack, the first and second quick-disconnect fluid connectors being arranged on a side of the rear face.

5. The cooling system according to claim 1, the descending and ascending pipes of the at least one main two-phase fluid circuit have a first cross-section and the first and second branches of the local circuits have a second cross-section, the first cross-section being at least twice as large as the second cross-section in surface and/or in diameter.

6. The cooling system according to claim 1, wherein the liquid phase of the working fluid is in a subcooled state in the descending pipe.

7. The cooling system according to claim 1, wherein an optional forced air convection is provided to improve the performances of the at least one heat rendering exchanger.

8. A parallelepiped-shaped metallic container forming an enclosure, with standard dimensions of the transport container type of 20 feet or 40 feet long, comprising a cooling system according to claim 1.

9. The parallelepiped-shaped metallic container according to claim 8, wherein the at least one heat rendering exchanger is arranged above the roof of the container.

10. The parallelepiped-shaped metallic container according to claim 8, wherein the at least one heat rendering exchanger is arranged adjacent to one side of the container, outside the container.

11. A cooling system for cooling a plurality of server boards located inside an enclosure, the cooling system comprising:

at least one main two-phase fluid circuit serving the plurality of server boards, with a descending pipe, an ascending pipe, a loop bottom connector and an upper portion, said upper portion being thermally coupled with at least one heat rendering exchanger located outside the enclosure, said at least one main two-phase fluid circuit operating according to the thermosiphon principle, at least one evaporator in each of the plurality of server boards served by the at least one main two-phase fluid circuit, said at least one evaporator being coupled to a hot source to be cooled down in the plurality of server boards, a plurality of local circuits, each of the local circuits respectively serving one of the plurality of server boards and operating in bypass with respect to the loop bottom connector of the at least one two-phase main circuit, each of the local circuits comprising on the one hand a first branch, forming a feed-in from a tapping in the descending pipe and, on the other hand, a second branch forming a fluid return in the ascending pipe of the at least one main two-phase circuit, as well as an auxiliary circuit internal to a respective one of the server boards connected to one or several of the at least one evaporator, wherein first and second fluid-tight quick-disconnect fluid connectors are further provided, arranged respectively on each of the first and second branches, wherein the cooling system operates with passive fluid flow throughout in the at least main two-phase circuit nor in the local circuits, and wherein the descending and ascending pipes of the at least main two-phase fluid circuit have a first cross-section and the first and second branches of the local circuits have a second cross-section, the first cross-section being at least twice as large as the second cross-section in surface and/or in diameter.

* * * * *